United States Patent [19]

Leung

[11] Patent Number: 5,457,408
[45] Date of Patent: Oct. 10, 1995

[54] METHOD AND APPARATUS FOR VERIFYING WHETHER A BITSTREAM RECEIVED BY A FIELD PROGRAMMABLE GATE ARRAY (FPGA) IS INTENDED FOR THAT FPGA

[75] Inventor: Wai-Bor Leung, Wescosville, Pa.

[73] Assignee: AT&T Corp, Murray Hill, N.Y.

[21] Appl. No.: 344,802

[22] Filed: Nov. 23, 1994

[51] Int. Cl.⁶ .................................................. H03K 19/177
[52] U.S. Cl. ............................................. 326/38; 326/39
[58] Field of Search ............................ 326/8, 38, 39, 326/41, 47; 364/490, 491

[56] References Cited

U.S. PATENT DOCUMENTS

| R. 34,363 | 8/1993 | Freeman, deceased | 326/39 |
| 4,642,487 | 2/1987 | Carter . | |
| 5,072,138 | 12/1991 | Slemmer et al. | 326/39 X |
| 5,237,609 | 8/1993 | Kimura . | |
| 5,311,080 | 5/1994 | Britton et al. . | |
| 5,313,520 | 5/1994 | Han . | |
| 5,347,519 | 9/1994 | Cooke et al. . | |

FOREIGN PATENT DOCUMENTS 0495642  7/1992  European Pat. Off. .

*Primary Examiner*—David R. Hudspeth

[57] ABSTRACT

A field programmable gate array (FPGA) which verifies that an incoming bitstream is intended for it prior to writing configuration data to programmable memory cells is described. The bitstream has an identification frame which includes an identification code for the targeted FPGA. A verification circuit in a memory controller verifies whether the bitstream is intended for the FPGA based upon the identification code. If the bitstream is intended for the FPGA, the configuration data is processed and stored in the programmable memory cells. If the bitstream is not intended for the FPGA, the FPGA may enter a standby mode, and the configuration process may be halted until a user resets the FPGA. The verification circuit can help prevent damage that may occur to the FPGA when bitstreams intended for a different size memory cell array are received by the FPGA.

21 Claims, 7 Drawing Sheets

5,457,408

1

METHOD AND APPARATUS FOR VERIFYING WHETHER A BITSTREAM RECEIVED BY A FIELD PROGRAMMABLE GATE ARRAY (FPGA) IS INTENDED FOR THAT FPGA

FIELD OF THE INVENTION

The present invention relates generally to integrated circuits, and, in particular, to field programmable gate arrays.

BACKGROUND OF THE INVENTION

Integrated Circuits have traditionally implemented a single function, or else functions that were defined by software programming. In either case, however, the logic architecture that implemented the functionality of the circuit was fixed during the design of the integrated circuit. More recently, integrated circuits have been developed whose logic architecture can be changed after manufacture. Field programmable gate arrays (FPGAs), for example, have been developed whose logic functions can be established by the user away from the place where they were manufactured. FPGAs are used in the implementation of random logic networks, data routing, code converters, instruction decoders, state sequencers, and a variety of other functions.

The programming of an FPGA by a user may be accomplished using fuse technology, which involves the physical modification of the manufactured integrated chip so as to connect or disconnect elements in the integrated chip, or by memory programming, which involves setting multiple memory bits on the integrated chip. The memory bits in turn control the connection of elements in the integrated chip. An FPGA typically includes an array of logic blocks and interconnection resources. Each logic block can be programmed to implement a particular function. Signal propagation is accomplished by means of the interconnect resources. By programming multiple logic blocks to implement logic functions and using the interconnect resources to propagate signals, a desired logic circuit can be implemented.

The functionality of an FPGA using static random access memory (SRAM), for example, may be defined by reading in a bitstream and storing it in a configuration memory. A bitstream typically contains a header, data frames and a trailer. The length of the data frames for FPGA chips having different array sizes or different logic capacities, however, is typically different. Problems may occur if a bitstream intended for a certain array size is sent to an FPGA chip with a different array size. The beginning of a data frame, for example, may be detected incorrectly and stop bits may be treated as configuration data. Also, the chip may be erroneously configured in a way that leads to input-output or internal signal contention. As a result, the chip may dissipate a lot of power, thereby harming or destroying the electrical or other characteristics of the chip. Furthermore, if input buffers on the FPGA chip were changed to output buffers, other chips connected to the FPGA may be damaged. Even if the array size of the target FPGA is consistent with the size of the bitstream, different FPGAs may have different routing structures. It is, therefore, desirable to provide a mechanism for verifying the FPGA chip for which a particular bitstream is intended so as to detect and prevent mismatches.

SUMMARY OF THE INVENTION

A field programmable gate array (FPGA), according to the principles of the present invention, may suitably comprise an array of programmable logic cells (PLCs) having at least one programmable function unit (PFU) and having associated routing resources. The FPGA also may comprise a plurality of programmable input/output cells (PICs), a plurality of programmable memory cells, and configuration logic. The FPGA also includes a verification unit that verifies whether a bitstream received by the FPGA is intended for the FPGA.

In one embodiment, the verification unit may suitably comprise a verification circuit having a comparator circuit with a hardwired identification code permanently stored in it. When a bitstream comprising an identification code for the targeted FPGA is received by the FPGA, the received identification code is compared to the hardwired identification code. The FPGA thereby verifies that the received bitstream is intended for it. Other verification arrangements may be readily envisioned. A method of using such an FPGA is also disclosed.

Other features and advantages of the present invention will be readily apparent by reference to the following detailed description and accompanying drawings.

DETAILED DESCRIPTION

Figure 1:
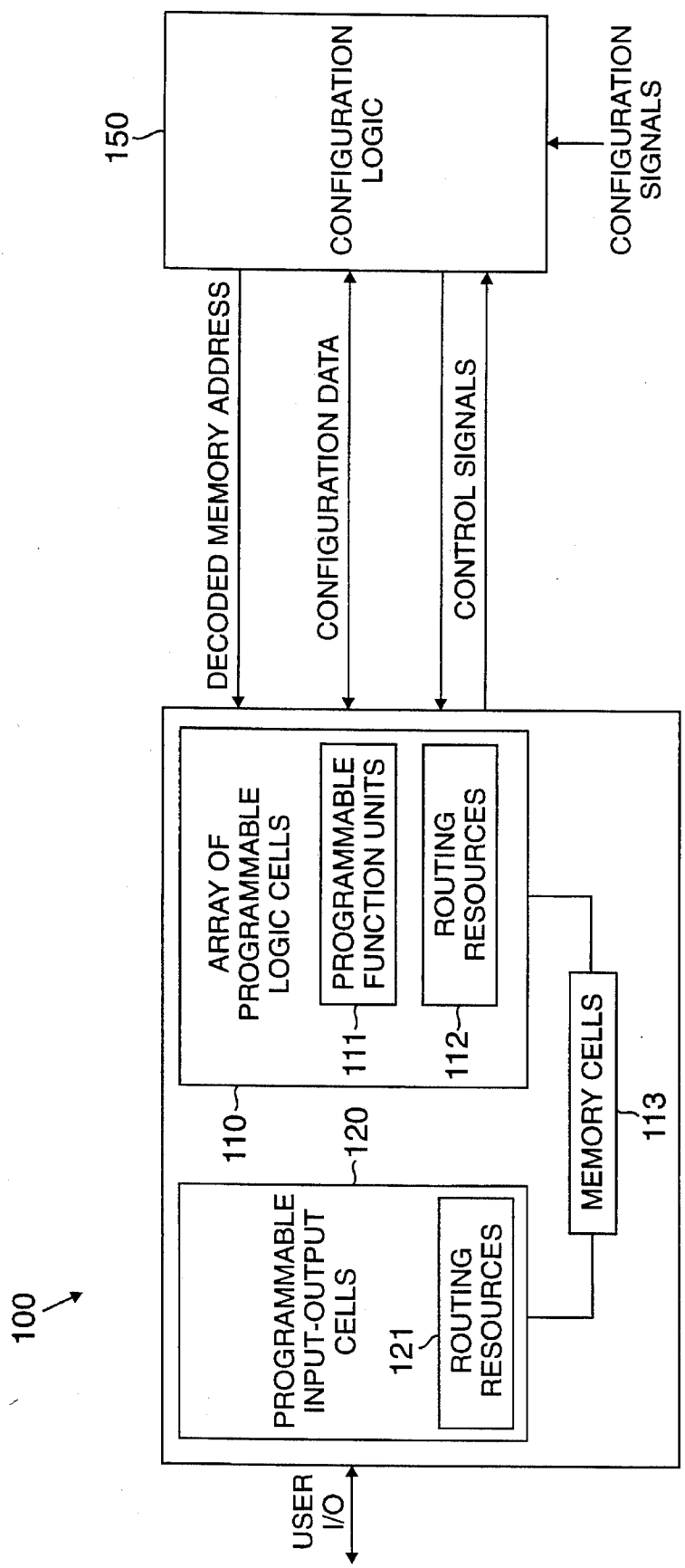
FIG. 1 is a functional block diagram of a field programmable gate array (FPGA).

FIG. 1 is a functional block diagram of a field programmable gate array (FPGA) 100. The FPGA 100 includes an array of programmable logic cells (PLCs) 110. The array of PLCs 110 is preferably surrounded by a plurality of programmable input/output cells (PICs) 120. Each PIC may suitably comprise the necessary input-output buffers to interface to bond pads. The PICs 120 also may include routing resources 121 needed to connect signals from the bonding pads to and from the PLCs.

Logic functions are performed in programmable function units (PFUs) 111, which are also known in the art as configurable logic blocks. The array of PLCs 110 thus has at least one PFU. Each PLC preferably, however, includes a single programmable function unit (PFU). The PLCs 110 also have associated routing resources 112. The FPGA 100 also comprises a plurality of programmable memory cells 113, such as random access memory (RAM), erasable programmable read only memory (EPROM), electrically erasable programmable read only memory (EEPROM), or the like. The routing resources 112, 121 typically include switching circuitry and metal interconnect segments. Configuration data indicating the nature of the user-programmed logic circuit is stored in the memory cells 113. The memory cells 113 may be conveniently organized by columns so that each read or write instruction to the memory cells 113 involves an entire column of memory cells.

When a user wishes to use the FPGA chip 100 to perform a specific function or operation, the FPGA chip 100 must be programmed with a bitstream. Configuration logic 150 is used to process configuration data entered by the user into the FPGA 100 and to write the contents of the configuration memory cells 113. Control signals pass between the array of programmable logic cells 110, the programmable input-output cells 120, the memory cells 113 and the configuration logic 150. Similarly, configuration data and decoded memory addresses pass between the PLCs 110, the PICs 120, the memory cells 113 and the configuration logic 150. Configuration signals, such as a reset signal generated by the user, may also be received by the configuration logic 150.

Figure 2:
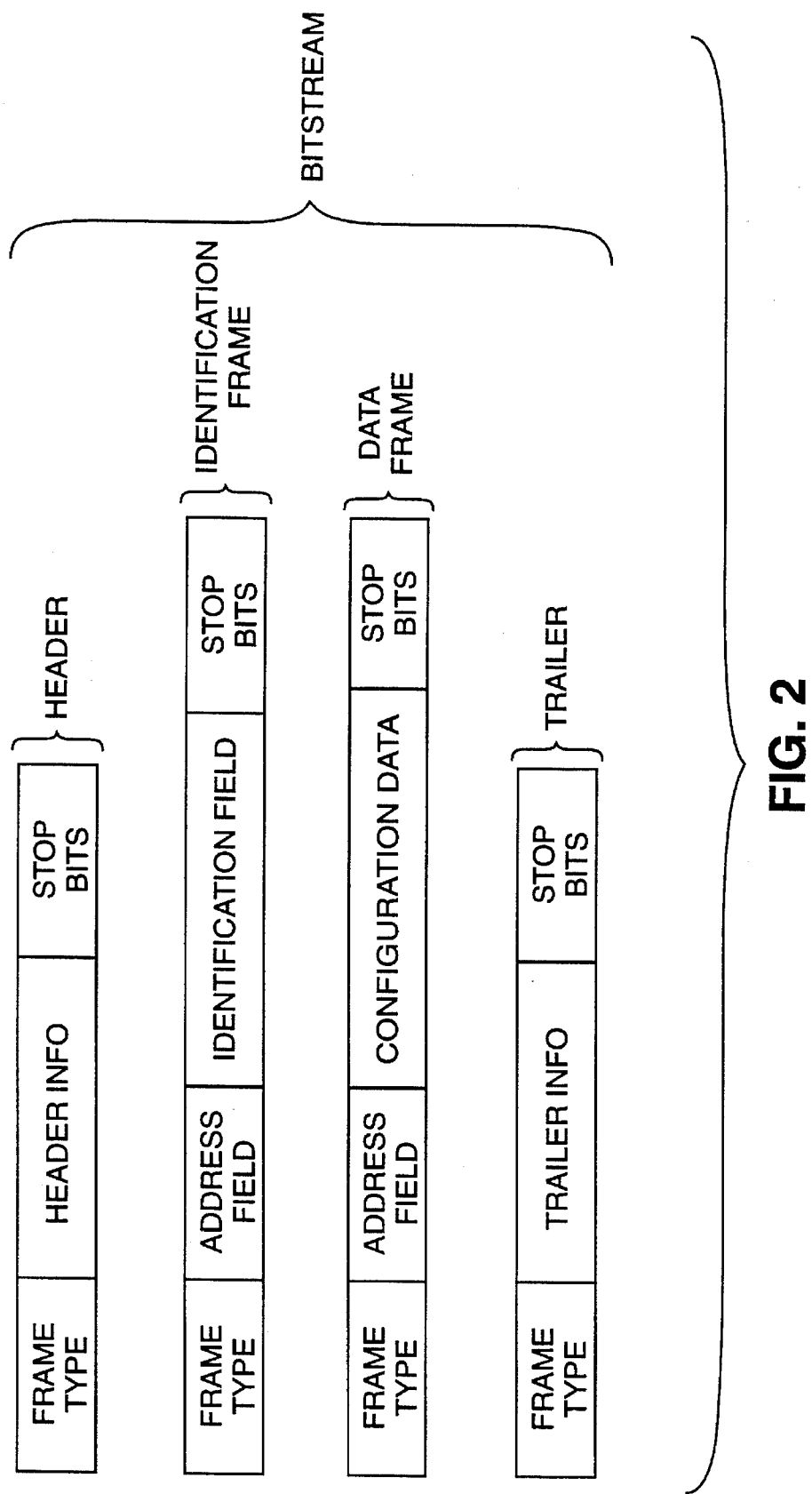
FIG. 2 illustrates an exemplary bitstream according to the principles of the present invention.

FIG. 2 illustrates an exemplary bitstream according to the principles of the present invention. The bitstream comprises a header frame which includes, for example, several bits of binary code indicating the frame type and additional bits containing header information. The header frame may suitably end with stop bits. According to the principles of the present invention, the bitstream preferably also includes an identification frame. In a presently preferred embodiment, the identification frame has a format similar to a data frame so as to minimize hardware overhead. In the presently preferred embodiment, the identification frame comprises several bits indicating the frame type and several bits for an address field. The identification frame also includes an identification field and stop bits. In the preferred embodiment, the identification frame has the same length for all array sizes and its length is smaller than the data frame of the smallest FPGA into which the bitstream may be or is likely to be entered. The width of the identification field, for example, may conveniently be sixty-four bits. The number of stop bits should preferably be chosen so that the overall length of the identification frame is equal to the length of a data frame of the target FPGA.

The identification field of the identification frame comprises identification data, including an identification code for the targeted FPGA type. In one embodiment of the invention, only some, for example twenty, of the sixty four bits in the identification field would be used for the unique identification code. The additional bits then may be used for other applications. For example, in a preferred embodiment, the first two bits of address fields are interpreted according to a check-parity bit in the identification field. The check-parity bit may, for example, be the first bit in the identification field. Thus, for example, if the check-parity bit is a binary '1' then the first two bits in the address fields would be interpreted as parity bits of the identification and data frames. If, on the other hand, the check-parity bit is a binary '0' then parity checking would be disabled and the first two bits of the address fields would be interpreted as the address bits for data frames. The remaining bits in the identification field may then be used for other applications.

The bitstream of FIG. 2 also includes at least one data frame. A typical data frame comprises several bits indicating the frame type, additional bits for an address field, multiple bits for specifying the configuration data, and stop bits. In a preferred embodiment, the identification frame precedes all the data frames in the bitstream. It may, however, alternatively be placed elsewhere within the bitstream. Finally, the bitstream includes a trailer for indicating the end of the bitstream. The trailer may suitably comprise several bits for specifying the frame type, additional bits for specifying trailer information, and stop bits.

Figure 3:
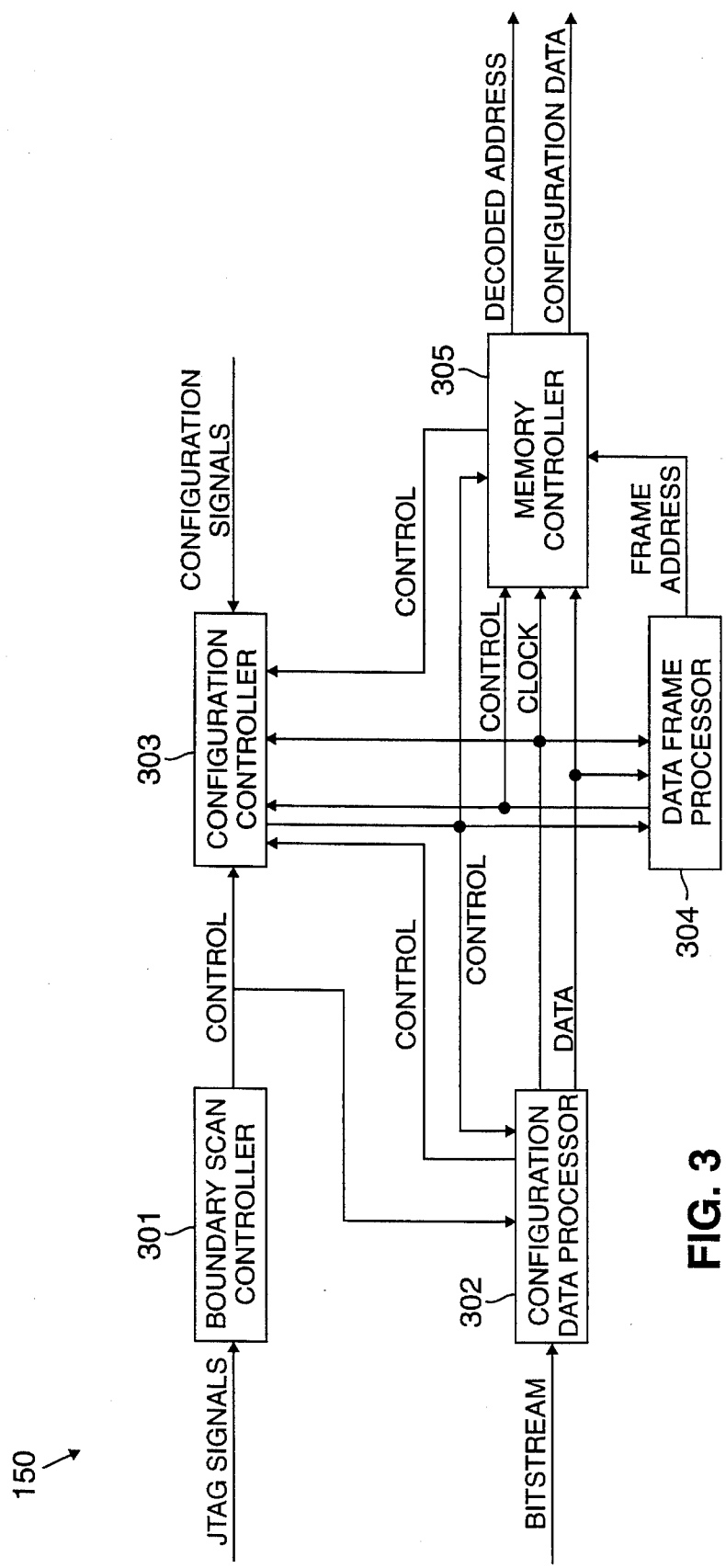
FIG. 3 is a functional block diagram of the configuration logic of the FPGA.

FIG. 3 is a functional block diagram of the configuration logic 150 of the FPGA 100. In a preferred embodiment, the configuration logic 150 comprises a boundary scan controller 301 which implements the IEEE standard 1149.1-1990, Standard Test Access Port and Boundary-Scan Architecture. This standard is a well-defined protocol that ensures interoperability among boundary-scan equipped devices from different vendors. The boundary scan controller 301 allows users to efficiently test the interconnection between integrated circuits on a PCB as well as test the integrated circuit itself. The boundary scan controller 301 receives joint test action group input signals and sends control signals to a configuration data processor 302 and a configuration controller 303.

The configuration data processor 302 receives and reads in the bitstreams and, if necessary, serializes the information contained in the bitstream. The configuration data processor 302 also may receive signals indicating the chip and mode of operation selected by the user, as well as appropriate clock or timing signals. The bitstream may be received, for example, one byte or one bit at a time. The configuration data controller then sends the information contained in the bitstream, as well as clock signals, to other units in the configuration logic 150.

The configuration controller 303 determines the proper sequence of operation for the configuration process. It also receives configuration signals and determines the proper sequence of operation for reset and re-configuration processes.

A data frame processor 304, which receives data from the configuration data processor 302, determines the type of data frame, stores the frame address, and computes the parity bits. The data frame processor 304 then sends the frame address to a memory controller 305. The memory controller 305 receives, in addition to the frame address, the configuration data contained in the data frames and the information contained in the identification frame of the bitstream. Control signals may also be sent between the various units of the configuration logic 150.

Figure 4:
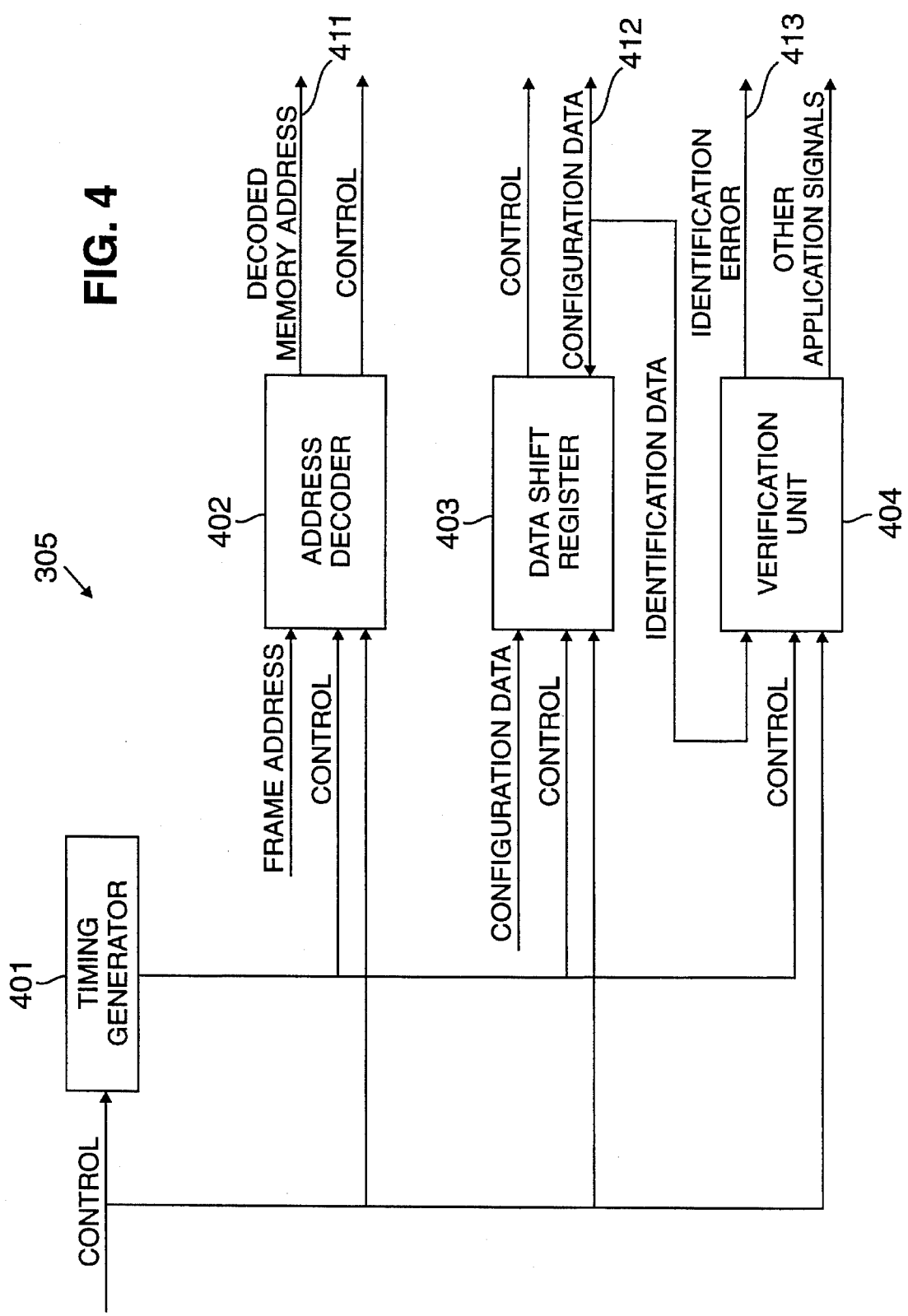
FIG. 4 is a functional block diagram of the memory controller in the configuration logic according to the principles of the present invention.

FIG. 4 is a functional block diagram of the memory controller 305. The memory controller 305 comprises a synchronous or asynchronous timing generator 401, an address decoder 402 and a data shift register 403. According to the principles of the present invention, the memory controller 305 also includes a verification unit 404, which comprises a verification circuit as described in greater detail below. The control signals may be received by each of the units in the memory controller 305 from the configuration controller 303. Similarly, the timing generator 401, which generates its own write pulses, sends timing signals to the address decoder 402, the data shift register 403 and the verification unit 404.

The address decoder 402 receives the frame address from the data frame processor 304 and decodes it. The data shift register 403 receives either configuration data or identification data depending upon the type of frame currently being processed. If the address field of the frame indicates that an identification frame is being processed, then the data shift register would reach the filled state after the first sixty-four bits are received. The identification data is then sent to the verification unit 404 which comprises an FPGA verification circuit. As further explained below in connection with FIG. 5, a comparator circuit in the FPGA verification circuit is enabled to check the twenty-bit identification code against a stored or hardwired identification code in the verification unit 404. The result is interpreted by an error handling circuit, and an identification-error signal, indicating whether to proceed with the configuration process or to enter into a standby mode, is provided on a lead 413. The additional bits contained in the identification field, such as the check-parity bit, may also be processed by the verification unit 404. Each of the units in the memory controller 305 may receive and send control signals.

If a data frame is being processed, then, when the data shift register 403 is filled, its content is driven onto a configuration data bus 412 which is connected to the memory cells 113. At the same time, the address decoder 402 drives a decoded memory address bus 411 which enables one column of memory cells.

Figure 5:
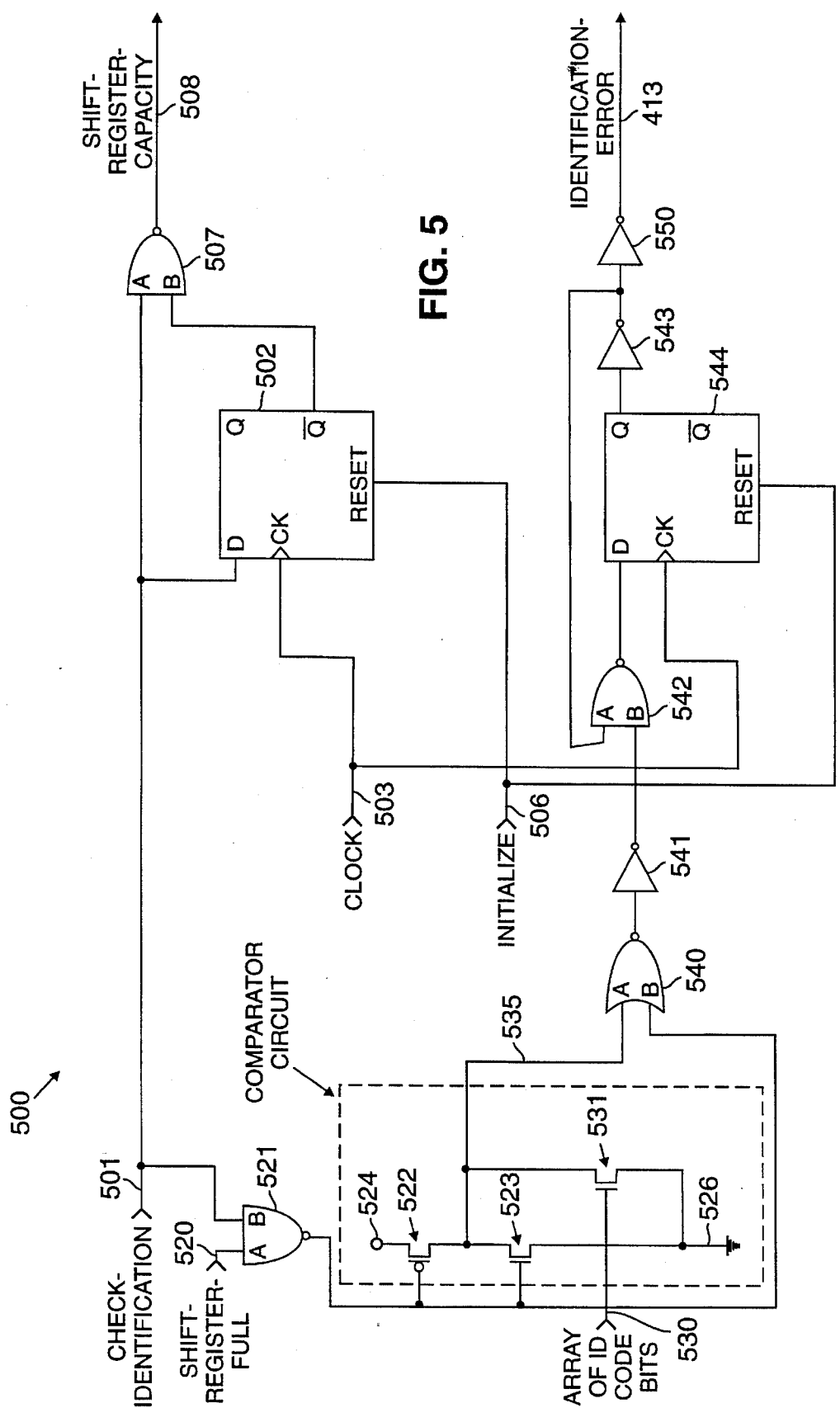
FIG. 5 is a circuit diagram of an exemplary verification circuit for use in the verification unit of the memory controller of FIG. 4.

FIG. 5 is a circuit diagram of an exemplary verification circuit 500 for use in the verification unit 404. The verification circuit 500 receives a check-identification signal on a lead 501. The check-identification signal is generated by the data frame processor 304 and is a digital high signal when the address field of the frame being processed indicates that it is an identification frame. The check-identification signal serves as the D input to a flip-flop 502. A clock signal is generated on a lead 503 and serves as the clock signal for the flip-flop 502. In a preferred embodiment, the clock signal on the lead 503 may be fed through two inverters in a known manner so as to buffer the clock signal before being sent to the flip-flop 502. An initialize signal is also generated on a lead 506. The initialize signal is a digital low signal for a certain period of time at the beginning of every configuration process and serves as a reset pulse to force the Q output of the flip-flop 502 to a digital low.

The check-identification signal and the complement of the Q output of the flip-flop 502 serve as inputs to a NAND gate 507. After the check-identification signal on the lead 501 becomes a digital high, the output of the NAND gate 507 on a lead 508 will become a digital low. The output of the NAND gate 507 returns to a digital high during the following clock cycle. The signal on the lead 508, labelled 'shift-register-capacity' is sent to the data shift register 403. When the shift-register-capacity signal is a digital low, the data shift register is considered full at a capacity of sixty-four bits, corresponding to the width of the identification field of the identification frame. When the shift-register-capacity signal is a digital high, the data shift register is considered full at a bit capacity corresponding to the number of configuration data bits in each data frame.

The verification circuit 500 also receives a shift-register-full signal on a lead 520. Once the data shift register is full, the shift-register-full signal becomes high. The shift-register-full signal and the check-identification signal serve as inputs to a NAND gate 521. When both the check-identification signal and the shift-register-full signal are digital high signals, the identification data is in the shift register 403 and is ready for verification. The output of the NAND gate 521, which would then be a digital low, serves as a first input of a NOR gate 540. Thus, when both the check-identification signal and the shift-register-full signal are digital highs, the NOR gate 540 is enabled.

A second input of the NOR gate 540 is the output 535 of a comparator circuit, which may suitably comprise a plurality of field effect transistors (FETs) appropriately interconnected. More specifically, the comparator circuit may suitably comprise a p-type FET 522 and an n-type FET 523 in a pull-up configuration. The drain of the FET 522, as shown in FIG. 5, is connected to a power source 524. The source of the FET 522 is connected to the drain of the FET 523, and the source of the FET 523 is connected to ground 526. The output of the NAND gate 521 serves as the gate signal for the FETs 522, 523.

The comparator circuit further comprises an array of n-type FETs represented by 531. The number of FETs in the array 531 equals the number of bits in the unique identification code established for the particular FPGA. Thus, for example, if the unique hardwired identification code contains twenty bits, there would be twenty FETs in the array 531. The FETs in the array 531 are connected such that the drain of each FET is tied to the source of the FET 522 and to the drain of the FET 523. The source of each FET in the array 531 is tied to ground 526.

The gate signal of each FET in the array 531 is hardwired to be either the true signal or the complement signal of a particular one of the bits in the identification code specified in the identification frame of the bitstream. Inverters may suitably be used to provide the complement signals of particular bits in the identification code such that if the correct identification code for the targeted FPGA is specified in the identification frame, then the gate signals on the FETs in the array 531 are all digital low signals. When all the gate signals of the FETs in the array 531 are low, then the output 535 of the comparator circuit, which serves as the second input of the NOR gate 540, will be a digital high. The NOR gate 540 would then generate a digital low as its output. In this manner, the unique identification code for the FPGA may be permanently stored and verified in the verification unit 404.

In contrast, if the identification code specified in the identification frame does not match the hardwired unique identification code of the targeted FPGA, then the gate signal of at least one FET in the array 531 will be a digital high. As a result, the output 535 of the comparator circuit will be a digital low. If the NOR gate 540 has been enabled to verify the identification code contained in the identification frame as explained above, then the NOR gate 540 will generate a digital high as its output.

The output of the NOR gate 540 is fed through an inverter 541. Thus, if the identification code contained in the identification frame of a bitstream matches the unique identification code that is hardwired in the FPGA, then the output of the inverter 541 is a digital high. This digital high signal would indicate that the identification code has been verified correctly and that the bitstream was intended for the targeted FPGA. If the identification code contained in the identification frame of the bitstream does not match the unique identification code that is hardwired in the FPGA, then the output of the inverter 541 is a digital low. This digital low signal would indicate that the identification code has not been verified correctly and that the bitstream was not intended for the targeted FPGA.

The output signal from the inverter 541 is then sent to a flip-flop circuit which generates an identification-error signal. If the identification code in the identification frame does not match the identification code that is stored in the comparator circuit, then the identification-error signal becomes a digital high and is latched, or in other words, does not change, until the user resets the FPGA chip 100. In particular, the output of the inverter 541 serves as a first input of a NAND gate 542. The output of the NAND gate 542 serves as the D input to a flip-flop 544.

The flip-flop 544 may be conveniently configured in a manner similar to the flip-flop 502. The clock signal generated on the lead 503 provides the clock signal for the flip-flop 544. As before, the clock signal on the lead 503 may be fed through two inverters in a known manner so as to buffer the clock signal before being sent to the flip-flop 544.

The initialize signal generated on the lead 506 serves as a reset pulse to force the Q output of the flip-flop 544 to a digital low at the beginning of every configuration process. The Q output of the flip-flop 544 is fed through an inverter 543. The output of the inverter 543 serves as the second input of the NAND gate 542 as well as the input of another inverter 550. The output of the inverter 550 is an identification-error signal on a lead 413 and is initialized to a digital low, indicating that there is no error.

If the output of the inverter 541 goes low, then the Q output of the flip-flop 544 generates a digital high signal during the following clock cycle. This digital high signal, indicating that an error in the verification process has occurred, propagates through the inverters 543,550, to the configuration controller 303. The FPGA would then enter a standby mode. A verification-error signal may be provided to the user, indicating that the identification code was not correctly verified. During the standby mode, the configuration process is halted until the user resets the FPGA chip 100. By halting the configuration process when the identification code indicates that the bitstream is not intended for the particular FPGA, the apparatus and method of the present invention help prevent damage to the FPGA chip or other chips connected to it.

Although a specific embodiment of the verification circuit has been discussed above, it will be obvious to persons of ordinary skill in the art that different logic circuits may be employed to perform the functions of verifying the received identification code and providing appropriate signals. For example, in one alternative embodiment, the comparator circuit would comprise a plurality of exclusive OR gates each having at least two inputs. One set of inputs would correspond to the bits of the identification code contained in the identification frame. A second set of inputs would be tied to the power supply 524 or to ground 526, depending upon the particular identification code that is being permanently stored in the verification unit 404. Similarly, the functions of verifying the received identification code and providing appropriate signals may be performed in software. Furthermore, although the verification unit and verification circuit are part of the configuration logic in the presently preferred embodiment, the verification unit and verification circuit may be located elsewhere in or on an FPGA chip according to the principles of the present invention.

Figure 6:
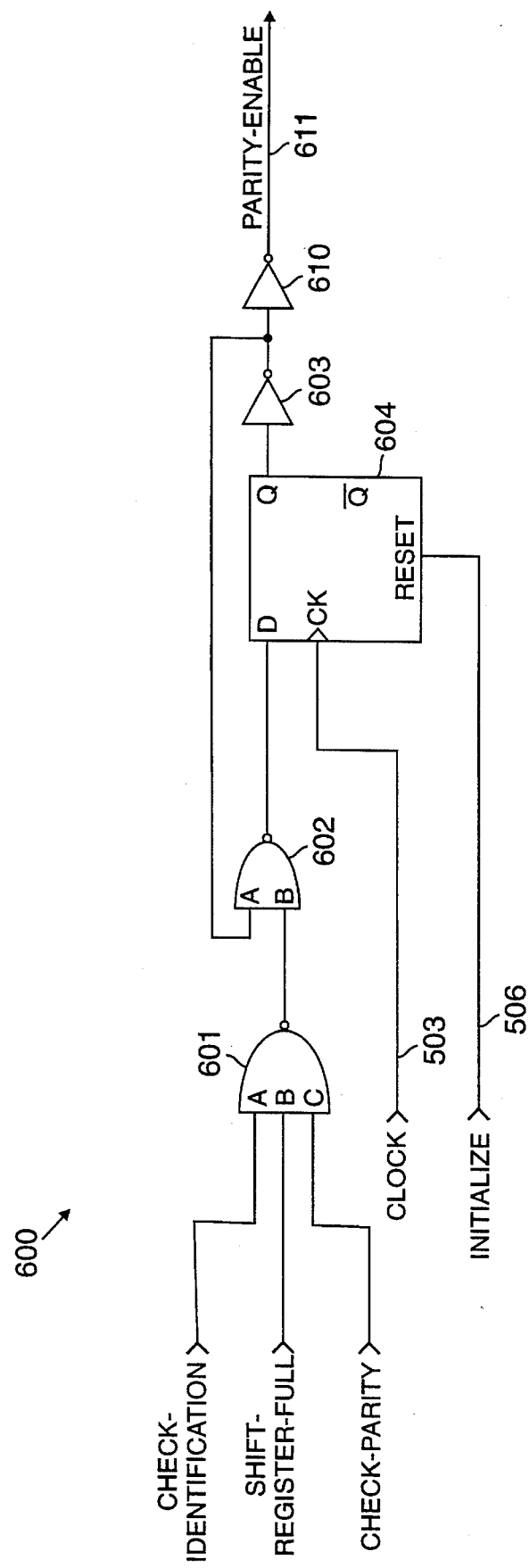
FIG. 6 shows additional circuitry which may be used to enable parity checking.

FIG. 6 shows additional circuitry 600 which may be used in conjunction with the verification circuit 500 to enable parity checking. The parity enabling circuitry 600 comprises a NAND gate 601 which receives the check-identification signal, the shift-register-full signal, and a check-parity signal as input signals. In a preferred embodiment, the value of the check-parity signal is determined by the check-parity bit specified in the identification field of the identification frame. Thus, for example, if the user-specified check-parity bit is a digital '1', then the value of the check-parity signal will be a digital high.

The output of the NAND gate 601 serves as a first input to another NAND gate 602. The NAND gate 602 and additional logic circuitry comprising a flip-flop 604 are configured in a manner that mirrors the flip-flop circuit of FIG. 5 comprising the NAND gate 542 and the flip-flop 544. The clock signal generated on the lead 503 provides the clock signal for the flip-flop 604. As before, the clock signal on the lead 503 may be fed through two inverters in a known manner so as to buffer the clock signal before being sent to the flip-flop 604. The initialize signal generated on the lead 506 serves as a reset pulse to force the Q output of the flip-flop 604 to a digital low at the beginning of every configuration process. The Q output of the flip-flop 604 is fed through the inverter 603. The output of the inverter 603 serves as the second input of the NAND gate 602 as well as the input of another inverter 610. The output of the inverter 610 is a parity-enable signal on a lead 611 and is initialized to a digital low, indicating that parity checking is disabled.

When all three input signals to the NAND gate 601, including the check-parity signal, are high, the output of the inverter 601 goes low. The Q input of the flip-flop 604 then generates a digital high signal during the following clock cycle. This digital high signal, indicating that parity checking is enabled, propagates through the inverters 603, 610, to the data frame processor 304 where parity checking may be performed as explained above.

Figure 7:
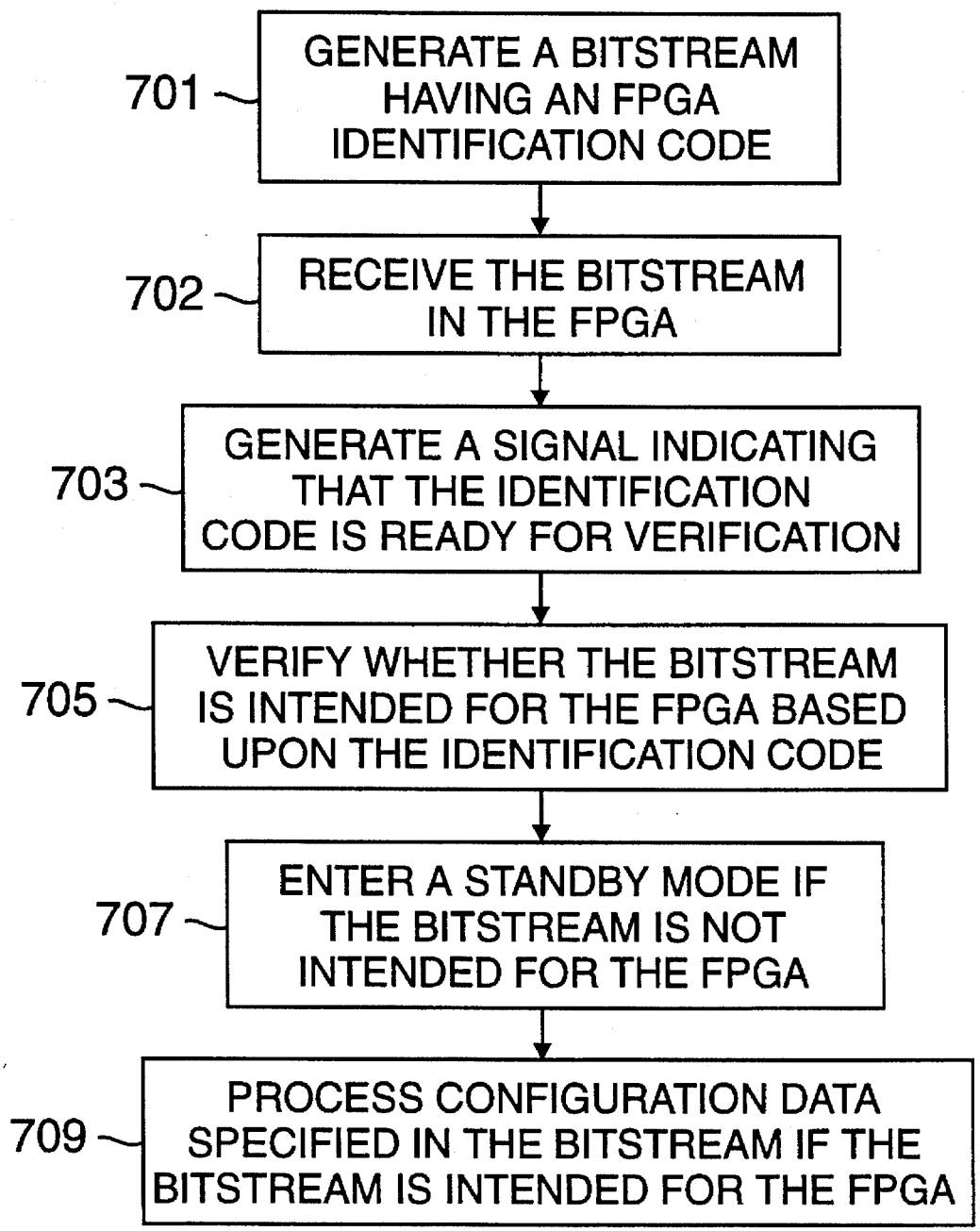
FIG. 7 is a flow chart showing steps of a method of using an FPGA according to the principles of the present invention.

FIG. 7 is a flow chart showing steps of a method of using an FPGA according to the principles of the present invention. As shown in step 701, a bitstream having an identification code is generated. The bitstream is received in the FPGA as shown in step 702. Next, as shown in step 703, a signal is generated indicating that the identification code is ready for verification. As indicated by step 705, the identification code is used to verify whether the bitstream is intended for the particular FPGA. If the bitstream is not intended for the particular FPGA, then, as shown in step 707, the FPGA enters a standby mode. As explained above, the configuration process is halted during the standby mode until the user resets the FPGA. A signal may be sent to the user indicating that the identification code was not correctly verified. On the other hand, if the bitstream is intended for the particular FPGA, then, as indicated by step 709, the FPGA processes any configuration data specified in the bitstream and stores the configuration data in the programmable memory cells.

Although the present invention has been described with reference to specific embodiments, it will be appreciated that other arrangements within the spirit and scope of the present invention will be readily apparent to persons of ordinary skill in the art. The present invention is, therefore, limited only by the appended claims.

I claim:

1. A field programmable gate array (FPGA) comprising:
   an array of programmable logic cells (PLCs) having at least one programmable function unit (PFU) and having associated routing resources;
   a plurality of programmable input/output cells (PICs);
   a plurality of programmable memory cells;
   configuration logic; and
   a verification unit that verifies whether a bitstream received by said FPGA is intended for said FPGA.

2. The FPGA of claim 1 wherein said verification unit comprises a verification circuit.

3. The FPGA of claim 2 wherein said verification circuit comprises a comparator circuit having a hardwired identification code.

4. The FPGA of claim 3 wherein said comparator circuit compares an identification code contained in said bitstream to said hardwired identification code.

5. The FPGA of claim 4 wherein said verification circuit provides a signal indicating whether the identification code contained in said bitstream matches said hardwired identification code.

6. The FPGA of claim 5 wherein the FPGA enters a standby mode if the identification code contained in said bitstream does not match said hardwired identification code.

7. The FPGA of claim 4 further comprising a flip-flop circuit that provides a latched signal indicating that the identification code contained in said bitstream does not match said hardwired identification code.

8. The FPGA of claim 2 wherein said verification circuit compares an identification code contained in said bitstream to an identification code that is stored in said verification circuit.

9. The FPGA of claim 1 wherein said verification unit compares an identification code contained in said bitstream to an identification code that is stored in said verification unit.

10. The FPGA of claim 4 wherein said FPGA further comprises means for generating a signal indicating that said identification code contained in said bitstream is ready for verification by said verification circuit.

11. The FPGA of claim 4 wherein said FPGA further comprises circuitry for generating a signal indicating that said identification code contained in said bitstream is ready for verification by said verification circuit.

12. The FPGA of claim 1 wherein said plurality of programmable memory cells comprises random access memory (RAM).

13. The FPGA of claim 1 wherein said plurality of programmable memory cells comprises erasable programmable read only memory (EPROM).

14. The FPGA of claim 1 wherein said plurality of programmable memory cells comprises electrically erasable programmable read only memory (EEPROM).

15. A method of using a field programmable gate array (FPGA) comprising the steps of:

generating a bitstream comprising an identification code;

receiving said bitstream in said field programmable gate array (FPGA); and verifying whether said bitstream is intended for said field programmable array (FPGA) based upon said identification code.

16. The method of claim 15 wherein the step of verifying comprises the step of comparing said identification code to an identification code stored in said FPGA.

17. The method of claim 15 wherein the step of verifying comprises the step of comparing said identification code to an identification code permanently stored in said FPGA.

18. The method of claim 16 further including the step of generating a signal indicating that the identification code in said bitstream is ready for verification.

19. The method of claim 16 further including the step of entering a standby mode if the identification code in said bitstream does not match the identification code stored in said FPGA.

20. The method of claim 16 wherein said bitstream further comprises configuration data and wherein said method further comprises the step of processing said configuration data if the identification code in said bitstream matches the identification code stored in said FPGA.

21. The method of claim 15 further including the step of processing configuration data in said FPGA, wherein the step of verifying take place prior to the step of processing.

* * * * *